US007037001B2

(12) United States Patent
Oomori

(10) Patent No.: US 7,037,001 B2
(45) Date of Patent: May 2, 2006

(54) OPTICAL MODULE HAVING AN EXTENSION MEMBER FOR CONNECTING A DEVICE TO A LEAD TERMINAL DISPOSED BEHIND THE SUB-MOUNT

(75) Inventor: Hirotaka Oomori, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 82 days.

(21) Appl. No.: 10/803,188

(22) Filed: Mar. 18, 2004

(65) Prior Publication Data

US 2004/0240497 A1 Dec. 2, 2004

(30) Foreign Application Priority Data

Mar. 19, 2003 (JP) ............................. 2003-076380

(51) Int. Cl.
*G02B 6/36* (2006.01)
(52) U.S. Cl. .......................................... 385/93; 372/31
(58) Field of Classification Search ............ 385/88–94; 372/34–36, 29.013
See application file for complete search history.

(56) References Cited

U.S. PATENT DOCUMENTS

| 4,403,243 | A | * | 9/1983 | Hakamada | .................. 257/772 |
|---|---|---|---|---|---|
| 4,768,070 | A | * | 8/1988 | Takizawa et al. | .............. 372/31 |
| 5,089,861 | A | * | 2/1992 | Tanaka et al. | ................. 372/36 |
| 5,504,349 | A | * | 4/1996 | Yoshino | ....................... 257/82 |
| 2003/0043868 | A1 | | 3/2003 | Stewart et al. | |
| 2004/0126066 | A1 | * | 7/2004 | Keh et al. | ...................... 385/92 |
| 2004/0184744 | A1 | * | 9/2004 | Uekawa | ....................... 385/93 |
| 2004/0228586 | A1 | * | 11/2004 | Kuhara | ........................ 385/92 |
| 2004/0240800 | A1 | * | 12/2004 | Uchida | ........................ 385/92 |

FOREIGN PATENT DOCUMENTS

| JP | 07-058413 | 3/1995 |
|---|---|---|
| JP | 11-295559 | 10/1999 |

* cited by examiner

*Primary Examiner*—Michelle Connelly-Cushwa
*Assistant Examiner*—Chris Chu
(74) *Attorney, Agent, or Firm*—Smith, Gambrell & Russell, LLP

(57) ABSTRACT

The present invention provides an optical module that clears the restriction of the arrangement of the lead terminal. The present optical module includes a CAN-type package having a stem, the thermoelectric device and a light-emitting device. The thermoelectric device is mounted on a front side of a sub-mount that protrudes form the stem. Lead terminals are co-axially disposed so as to surround the sub-mount. The optical module further contains extension members to connect electrically the thermoelectric device disposed in the front side of the sub-mount to lead terminals disposed behind the sub-mount.

10 Claims, 12 Drawing Sheets

OPTICAL MODULE HAVING AN EXTENSION MEMBER FOR CONNECTING A DEVICE TO A LEAD TERMINAL DISPOSED BEHIND THE SUB-MOUNT

BACKGROUND OF THE INVENTION

1. Field of the Invention

This invention relates to an optical module having a CAN-type package.

2. Related Prior Art

It is known that an optical module having a CAN-type package has two types. One type is for a light-transmitting module that provides a semiconductor laser mounted on a heat sink. Anode and cathode electrodes of the semiconductor laser are connected to respective lead terminals with bonding wires. Another type is for a light-receiving module that provides a photodiode therein. Anode and cathode of the photodiode are connected to respective lead terminals with bonding wires.

These CAN-type packages used in such light-transmitting module and the light-receiving module have three or four lead terminals for extracting and providing an electrical signal to and from optical semiconductor devices, and supply electrical power to devices.

In the CAN-type package, the lead terminal is provided in the stem. The stem has a disk-shape. In order to install a thermoelectric device such as a Peltier device, further to the optical semiconductor device, into the CAN-type package, additional lead terminals must be provided for the thermoelectric device. The devices within the module, as explained above, are connected to the corresponding lead terminal with bonding wires. The arrangement of the lead terminal is restricted to the position where the wire bonding from the device to the lead terminal is possible. However, in the CAN-type package, especially in the case that the device is mounted on the sub-mount that is disposed on the stem, the lead terminal behind the sub-mount can not be connected to the device mounted in front of the sub-mount.

Therefore, an object of the present invention is to provide an optical module in which the restriction relating to the arrangement of the lead terminal is cleared.

SUMMARY OF THE INVENTION

One aspect of the present invention relates to an optical module comprises a CAN-type package having, a thermoelectric device and a light-emitting device. The package includes a stem, a sub-mount having a mounting surface and a plurality of lead terminals. The mounting surface is substantially perpendicular to the stem. The stem provides the sub-mount and the plurality of lead terminal thereon. The thermoelectric device is disposed on the mounting surface, and the light-emitting device is mounted on the thermoelectric device.

The lead terminals are co-axially disposed in the stem so as to surround the sub-mount. The module may further include an extension member fixed to one of the lead terminal disposed behind the sub-mount and electrically connected to the thermoelectric device disposed in front of the sub-mount.

The extension member may have a side fixed to the lead terminal disposed behind the sub-mount such that the extension member detours around a side surface of the sub-mount or around a top surface of the sub-mount.

The extension member may be an L-shaped metallic component, which has two sides and one elbow portion between two sides. One of two sides is fixed to the lead terminal and the other of two sides is electrically connected to the thermoelectric device with a bonding wire.

The extension member may be a U-shaped metallic component, which has two outer sides, an inner side and two elbow portions between one of the outer side and the inner side. One of outer side is fixed to the lead terminal disposed behind the sub-mount and the other of outer sides is electrically connected to the thermoelectric device disposed in front of the sub-mount. The inner side of the extension member detours around the side surface of the sub-mount.

The extension member may be a U-shaped metallic component, which has two outer sides, an inner side and two elbow portions each connecting the outer side and the inner side. The inner side is fixed to the lead terminal disposed behind the sub-mount and two outer sides sandwich the lead terminal therebetween. One of outer sides detours around the side surface of the sub-mount and is electrically connected to the thermoelectric device disposed in front of the sub-mount.

The extension member may have a hollow to fix the lead terminal thereto with solder. Moreover, the extension member may have a groove for receiving excess solder.

DETAILED DESCRIPTION OF PREFERRED EMBODIMENTS

Preferred embodiments of the present invention will be described as referring to accompanying drawings. In the explanation, same elements will be referred as same numerals and symbols without overlapping explanation.

(First Embodiment)

Figure 1:
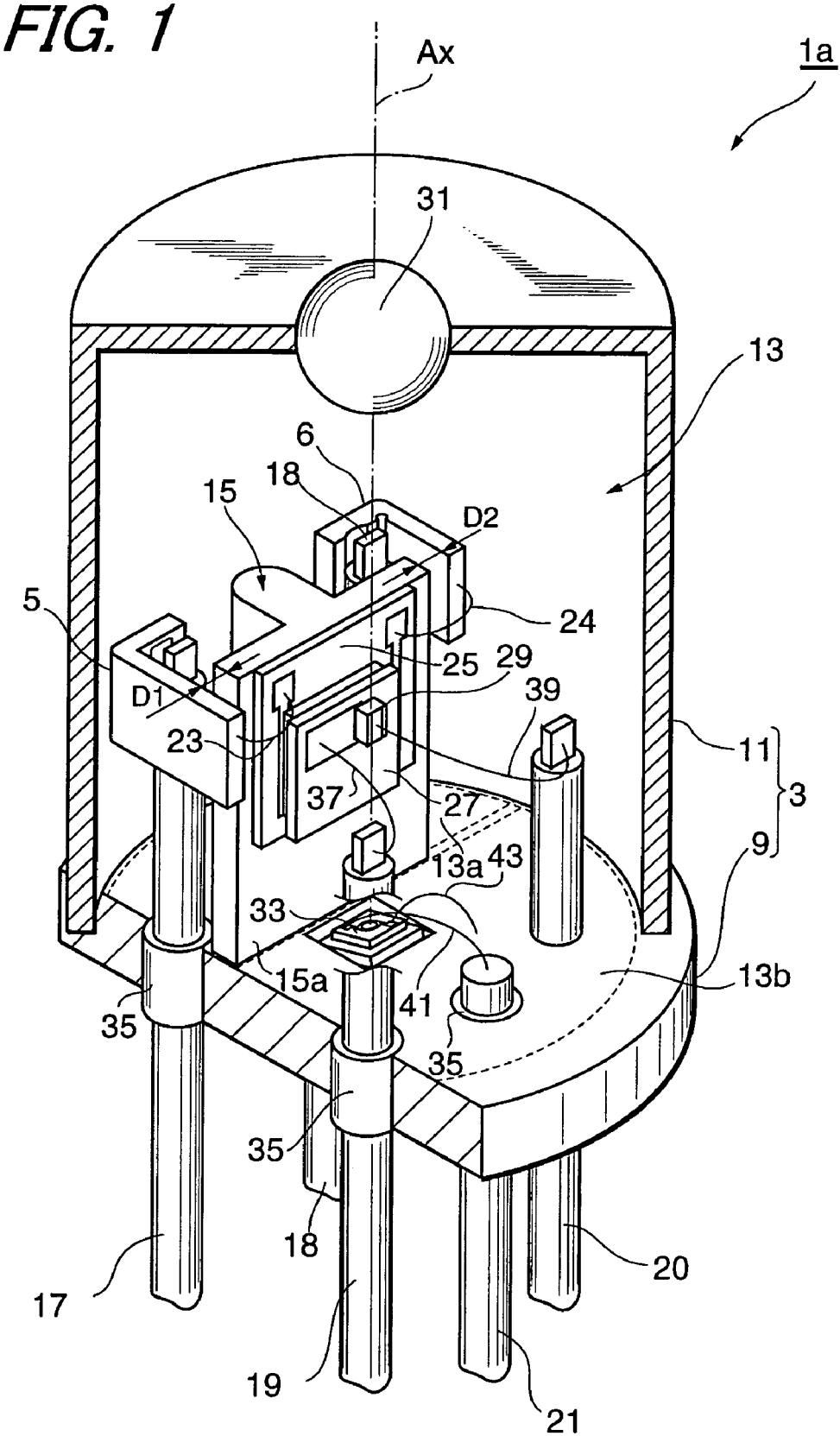
FIG. 1 is a partially cut perspective view showing an optical module according to the first embodiment of the present invention.
Figure 2:
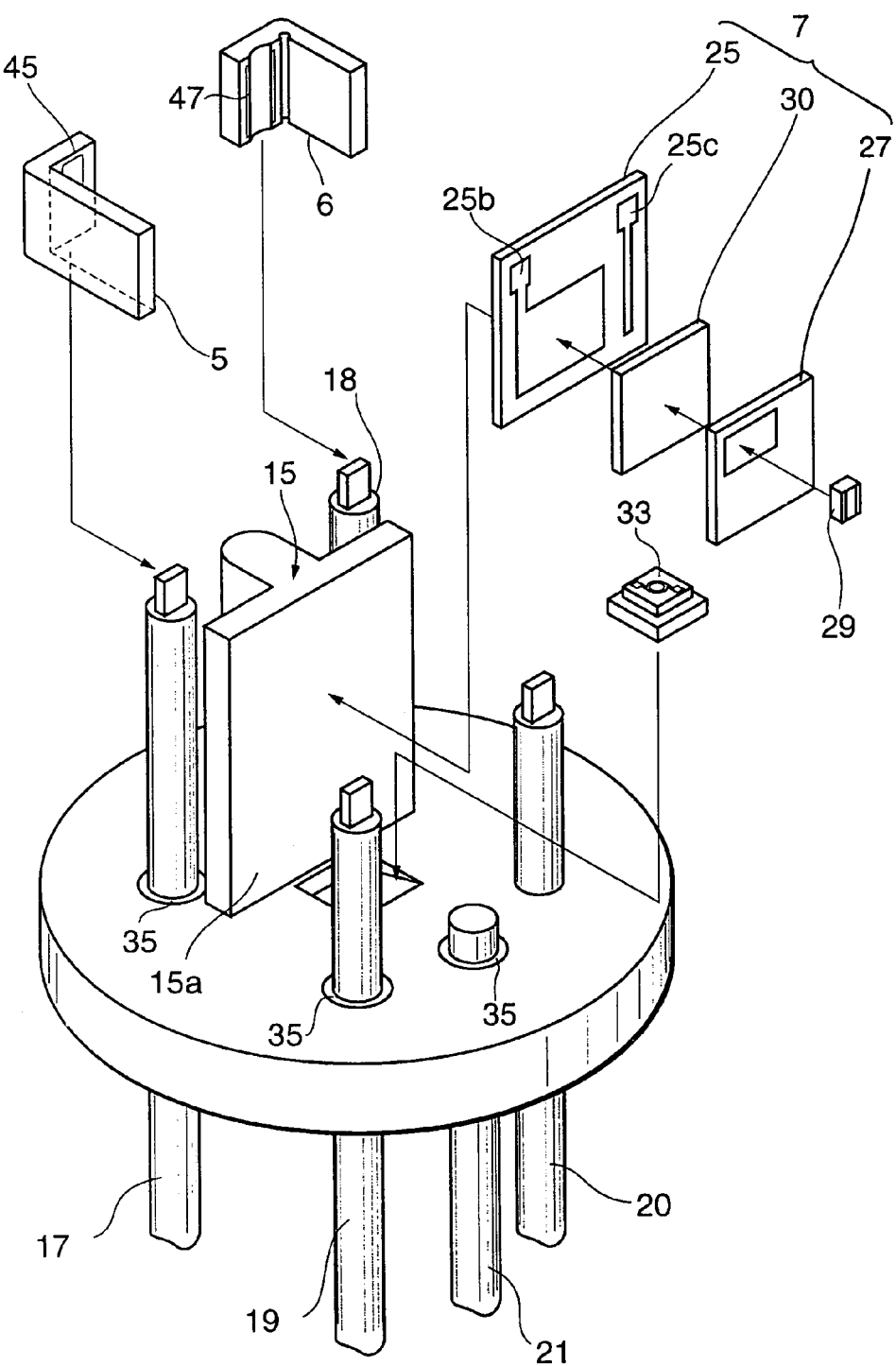
FIG. 2 is an exploded view of the primary portion of the optical module.
Figure 3:
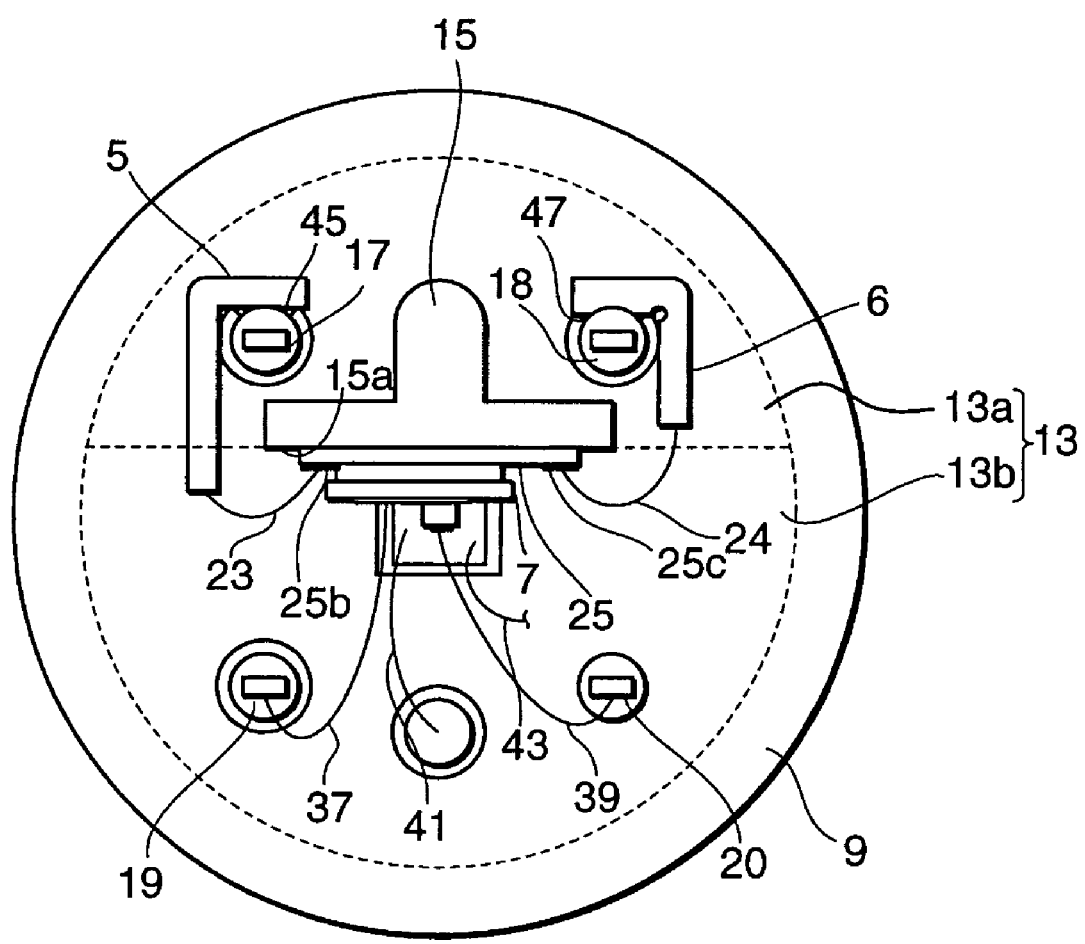
FIG. 3 is a plan view of the primary portion of the optical module.
Figure 4:
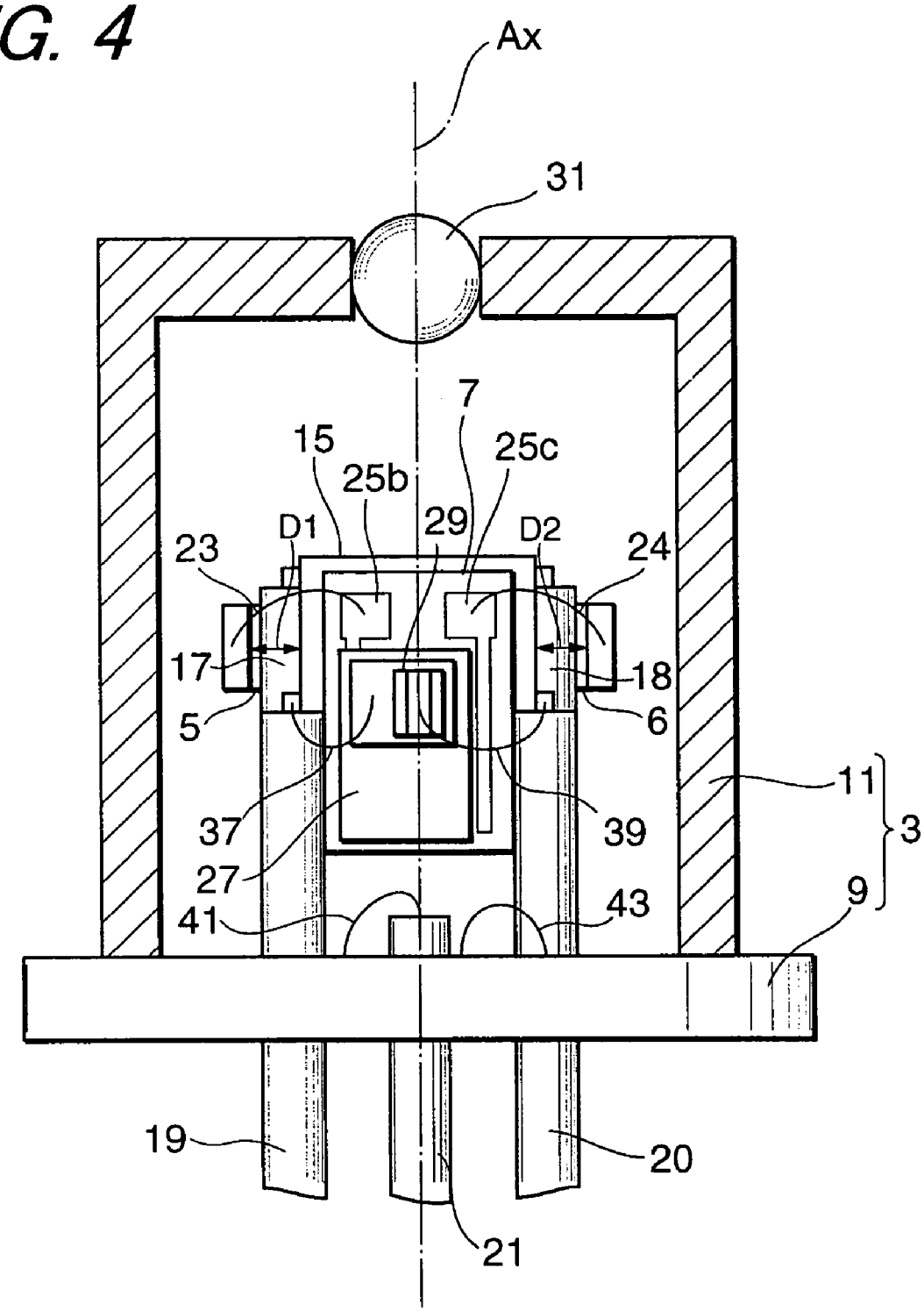
FIG. 4 is a side view of the optical module.

FIG. 1 is a partially cutaway view, FIG. 2 is an exploded view, FIG. 3 is a side view and FIG. 4 is a plan view of an optical module according to the first embodiment of the present invention.

The optical module 1a comprises a CAN-type package 3, a first extension member 5 and a thermoelectric device 7. The CAN-type package 3 includes a stem 9 and a lens holder 11 for forming a space 13 cooperating with the stem 9. The stem 9 and the lens holder 11 are made of metal such as iron coated by nickel and gold.

The stem 9 has a disk shape, and includes a sub-mount 15 and a plurality of lead terminals 17, 19 and 21. The sub-mount 15 is provided on the primary surface of the stem 9 and protrudes along the axis Ax. The lead terminals 17, 19 and 21 pass through corresponding via-holes formed in the stem, respectively.

The sub-mount 15 includes a mounting surface 15a that intersects the primary surface of the stem 9 and divides the space 13 into a first region 13a and a second region 13b. The lead terminal 17 locates in the first region 13a, while the lead terminals 19 and 21 locate in the first region 13a in the space 13. The first extension member 5 has an L-shaped cross section having at least one elbow portion, and one side thereof is fixed to the lead terminal 17.

The thermoelectric device 7 is mounted on the mounting surface 15a. The thermoelectric device, shown in FIG. 1, which is typically made from a Peltier element, is provided on the second region 13b in the space 13 and electrically connected to one end of the first extension member 5.

In the optical module 1a, the lead terminal 17, different from other lead terminals 19 and 21, is disposed on a position where the thermoelectric device 7 can not be directly connected thereto with a bonding wire. However, by using the first extension member 5, the lead terminal 17 disposed in the first region 13a, behind the sub-mount 15, can be electrically connected to the thermoelectric device 7 disposed in the second region 13b. By connecting the end of the first extension member 5 to the thermoelectric device 7 with a bonding wire 23, the thermoelectric device 7 can be conducted to the lead terminal 17 disposed behind the sub-mount 15. Thus, the optical module 1a may clear the restriction of geometrical arrangement of the lead terminal.

The optical module 1a further provides a second extension member 6 and other lead terminals 18 and 20. The lead terminal 18 is disposed in the first region 13a, while the lead terminal 20 is disposed in the second region 13b.

The thermoelectric device 7 includes a thermoelectric element 30, a lower substrate 25 directly mounted on the mounting surface 15a and an upper substrate 27 on which a light-emitting device 29 in mounted. On the lower substrate 25 is provided two wiring patterns 25b and 25c, and the thermoelectric element 30 is disposed between these wiring patterns 25b and 25c so as to electrically connect them to each other.

The optical module 1a further provides the light-emitting device 29, such as a semiconductor laser diode, on the upper substrate 27 of thermoelectric device 7. The light-emitting device 29 is optically coupled with a lens 31 held by the lens holder 11. Moreover, the optical module 1a has a light-receiving device 33, such as a semiconductor photodiode, mounted on a surface inclined to the primary surface of the stem 9. The light-receiving device 33 is optically coupled with the light-emitting device 29. The light-receiving device 33 operates as a monitoring device for the light-emitting device 29. Since the extension members 5 detours around the sub-mount 15, the thermoelectric device 7 disposed on the mounting surface 15a, namely in front of the sub-mount 15, can be electrically connected to the lead terminal 17 disposed behind the sub-mount 15.

As shown in FIG. 1 and FIG. 2, a geometrical relation similar to that between the first extension member 5 and the lead terminal 17 is realized between the second extension member 6 and the lead terminal 18. The lead terminal 18, disposed in the first region 13a, namely behind the sub-mount 15, may be electrically connected to the thermoelectric device 7 mounted in front of the sub-mount 15 via the second extension member 6.

The first extension member 5 extends along a side surface of the sub-mount 15 apart by a gap D1. Similar gap is provided for the second extension member 6, namely, the second extension member 6 detours around another side surface of the sub-mount 15 apart by a gap D2 therefrom.

The first extension member 5 is fixed to the lead terminal 17 with solder. The second extension member 6 is also fixed to the lead terminal 18 with solder. In the second extension member 6, a hollow is formed in its inner surface so as to fit the lead terminal thereto. The surplus solder spills into a groove 47 formed immediately by the hollow.

The lead terminals from 17 to 21 except the lead terminal 20 are isolated from the stem such that an insulating material 35, such as a sealing glass, fills and hermetically seals a space between each lead terminals and the stem 9. The other lead terminal 20 is directly connected to the stem 9.

According to the arrangement of the present optical module 1a, the wiring patterns 25b and 25c of the lower substrate 25, and end surfaces of the first and second extension members 5, 6, are extending parallel to the mounting surface 15a of the sub-mount 15, whereby the wire bonding between the thermoelectric device 7 and the extension members 5, 6 can be done without difficulty. Similarly, the wiring pattern on the upper substrate 27, the electrode of the light-emitting device 29, and the tip portion of the lead terminals 19 and 20 are extending substantially parallel to the mounting surface 15a, thereby enabling the wire bonding therebetween without difficulty.

As shown in FIG. 4, the first 5 and second extension members 6 locate between the sub-mount 15 and an inner surface of the lens holder 11. According to this arrangement, the thermoelectric device 7 and the light-emitting device 29 are not restricted in their positions, because two extension members do not interfere the optical axis Ax connecting the light-emitting device 29 and the lens 31.

According to the present optical module 1a thus described with accompanying drawings, the optical module 1a includes the thermoelectric device 7, such as Peltier device, and the light-emitting device 29 on the thermoelectric device 7, namely, an optical module including a Peltier device in the CAN-type and disk shaped package can be realized.

When an optical module having a CAN-type package includes a semiconductor laser diode and a semiconductor photodiode, it is inevitable to provide three or four lead terminals to provide or extract signals from or to such optical semiconductor devices. Because of the geometrical restriction in the CAN-type package, it is quite hard to increase the number of lead terminal. To increase the lead terminal leads the increase of the diameter of the stem. However, according to the arrangement of the present optical module, various devices not only the semiconductor laser diode and the semiconductor photodiode but also the Peltier device can be installed within the CAN-type package, which enhances the performance of the optical module.

(Second Embodiment)

Figure 5:
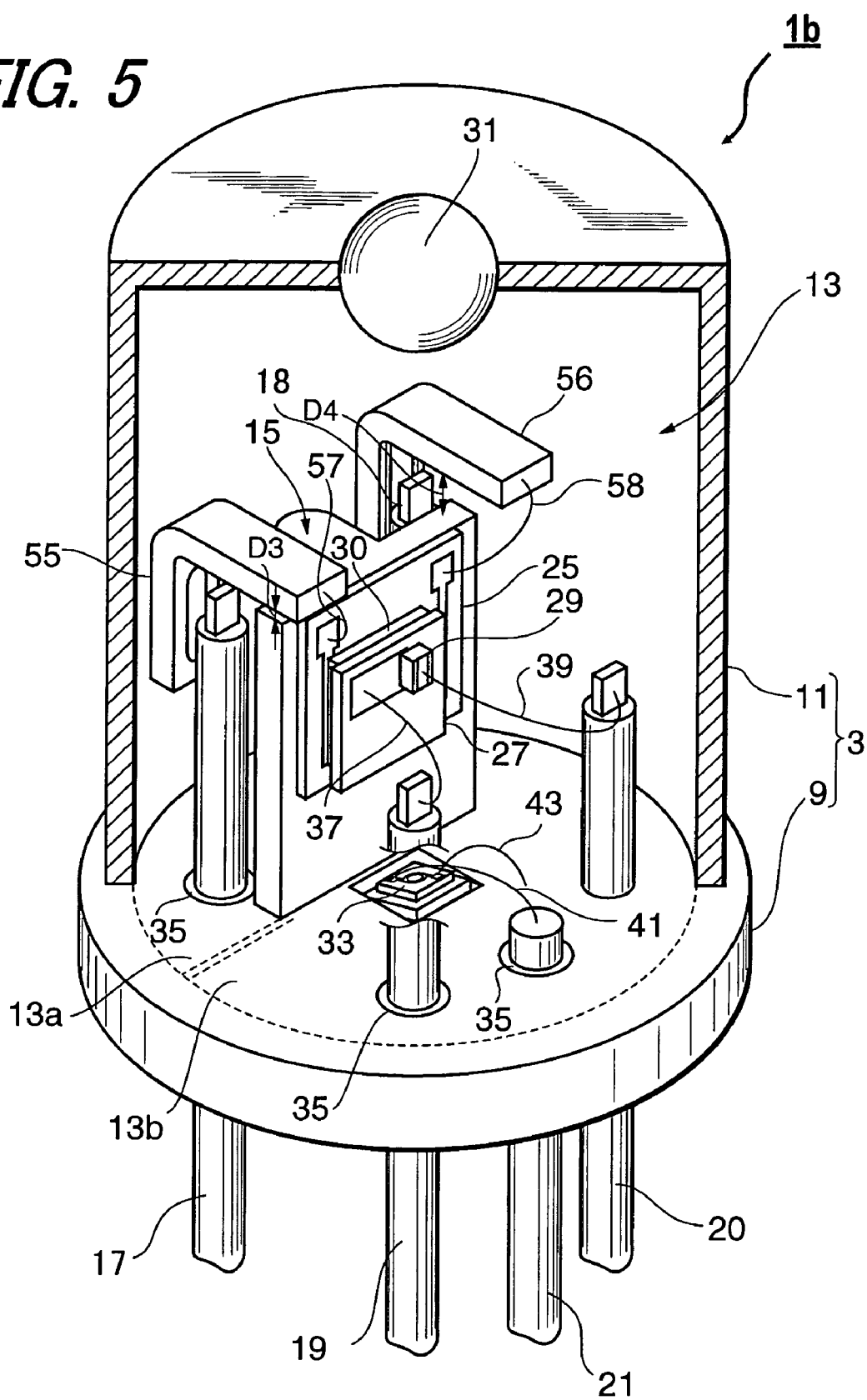
FIG. 5 is a perspective view showing an optical module according to the second embodiment of the present invention.
Figure 6:
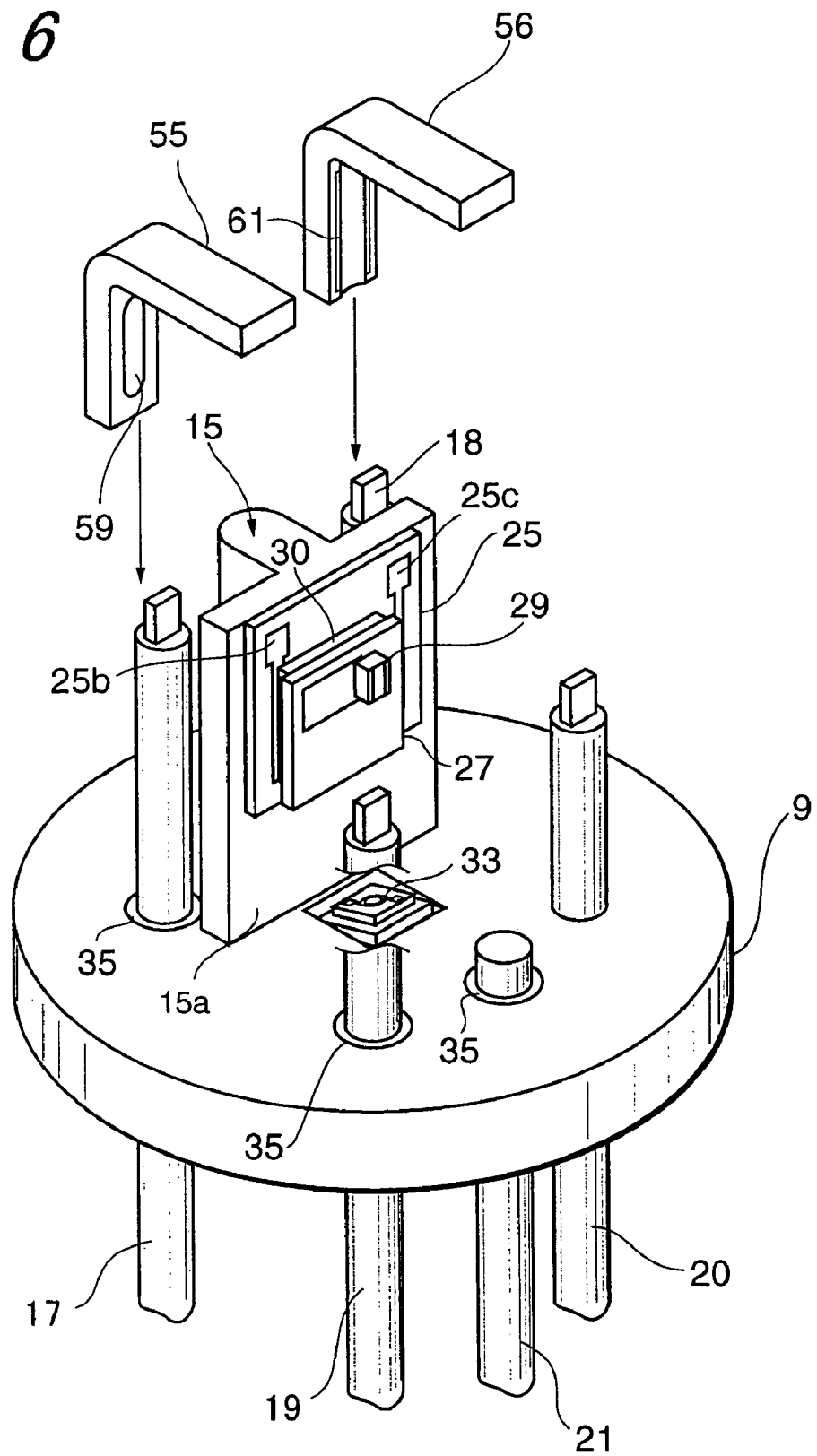
FIG. 6 shows a primary portion of the optical module shown in FIG. 5.
Figure 7:
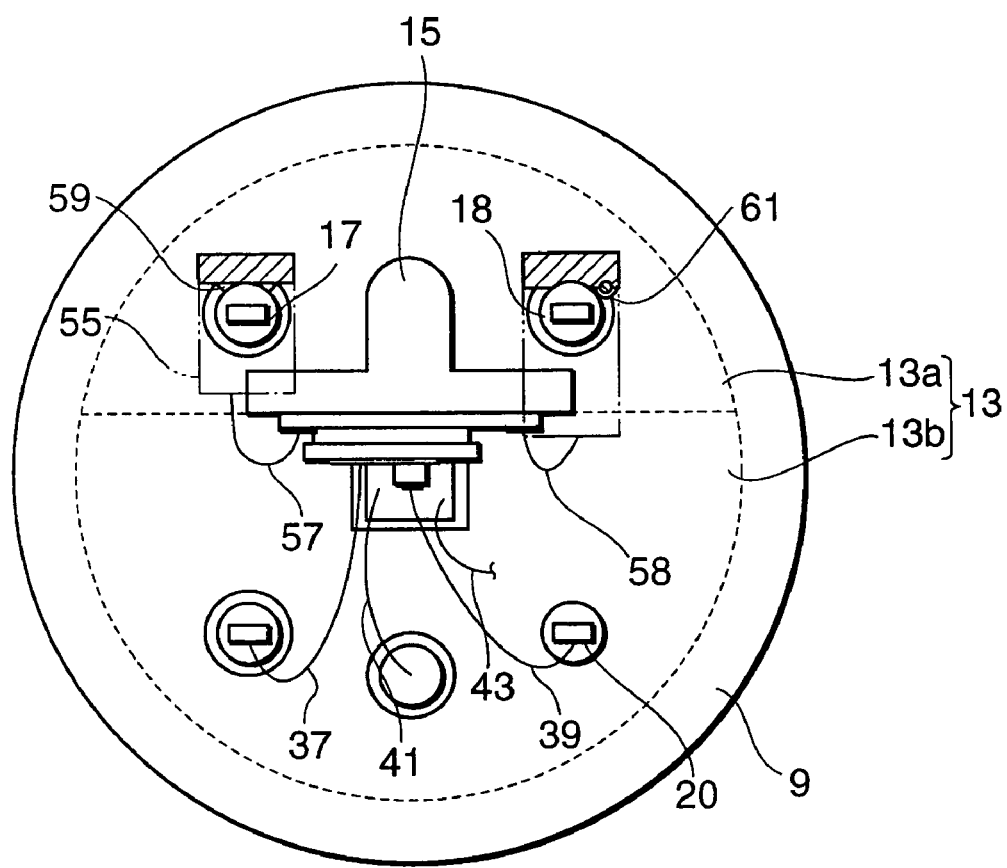
FIG. 7 is a plan view of the optical module according to the second embodiment.
Figure 8:
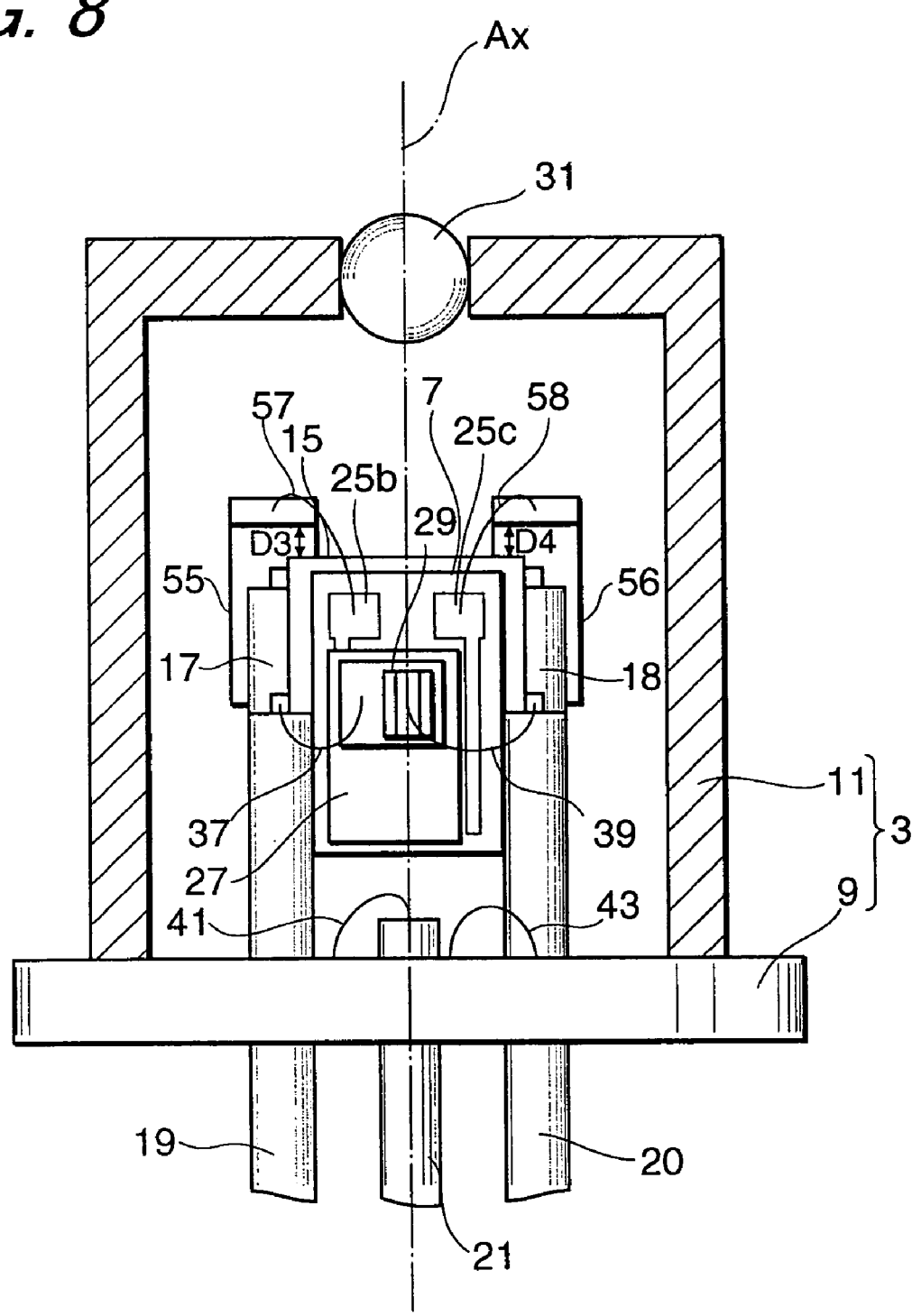
FIG. 8 is a side view of the optical module according to the second embodiment.

FIG. 5 shows an optical module 1b according to the second embodiment of the present invention. FIG. 6 is an exploded view, FIG. 7 is a side view and FIG. 8 is a plan view of the optical module 1b according to the second embodiment, respectively.

The optical module 1b has another type of extension member 55 instead of the extension member 5 used in the first embodiment. The extension member 55 is an L-shaped component with at least an elbow portion. The thermoelectric device 7 is wire-bonded to the end of the extension member 55.

In the optical module 1*b*, the lead terminal 17, different from the lead terminals 19 and 20, is positioned from where the thermoelectric device 7 can not be directly wire-bonded. However, by using the extension member 55, the lead terminal 17 provided in the first region 13*a*, behind the sub-mount 15, can be connected to the thermoelectric device 7 in the second region 13*b* of the space 13, in front of the sub-mount 15, with a bonding wire 57.

Another extension member 56 is also an L-shaped component with at least an elbow portion. One side of the extension member 56 is fixed to the lead terminal 18 and the other side thereof is wire-bonded to the thermoelectric device 7. This arrangement enable to connect the thermoelectric device 7 provided in the first region 13*a* to the other extension member 56 with a bonding wire 58.

Referring to FIG. 5, the extension member 55 is apart from the upper surface of the sub-mount 15 by a gap D3, while the other extension member 56 is, similarly to the extension member 55, apart by a gap D4 from the upper surface of the sub-mount 15.

The extension member 55 is fixed to the lead terminal 17 with solder. The other extension member 56 is also fixed to the lead terminal 18 with solder. The extension member 56 is provided with a hollow 59 for aligning the lead terminal 18 therein, and the lead terminal 18 is fixed in the hollow of the extension member 56 with solder. Excess solder may flow into grooves 61 formed in the inner surface of the extension member immediately by the hollow. An adhesive instead of solder may be used for fixing the extension member 55 and 56 to the lead terminal.

As shown in FIG. 7, in the optical module 1*b*, the surfaces of the extension members 55 and 56, where the wire bonding is carried out thereto, are parallel to the mounting surface 15*a* of the sub-mount 15, therefore the wire bonding can be performed without problems. Similarly, bonding surfaces provided in the tip portion of the lead terminal 19 and 20 are parallel to the surface of the light-emitting device 29 and also to the mounting surface 15*a* of the sub-mount 15, whereby the wire bonding between these surfaces may be performed without problems.

As shown in FIG. 8, in the optical module 1*b*, the extension members 55 and 56 are set between the ceiling of the lens holder 11 and the sub-mount 15. According to this arrangement, the positions of the light-emitting device and also the thermoelectric device are not restricted due to the existence of the sub-mount 15 because the axis AX connecting the light-emitting device to the lens does not disturbed by the existence of the extension members 55 and 56, thereby installing the thermoelectric device within the CAN-type package.

(Third Embodiment)

FIG. 9 to FIG. 12 show modifications of the extension member 5 and 6. Extension members in these embodiments shown in FIGS. 9 to 12 also enable to electrically connect the lead terminal 17 disposed in the first region 13*a*, behind the sub-mount 15, with the thermoelectric device 7 disposed in the second region 13*b*, in front of the sub-mount. Next, these modified extension members will be described in detail.

Figure 9:
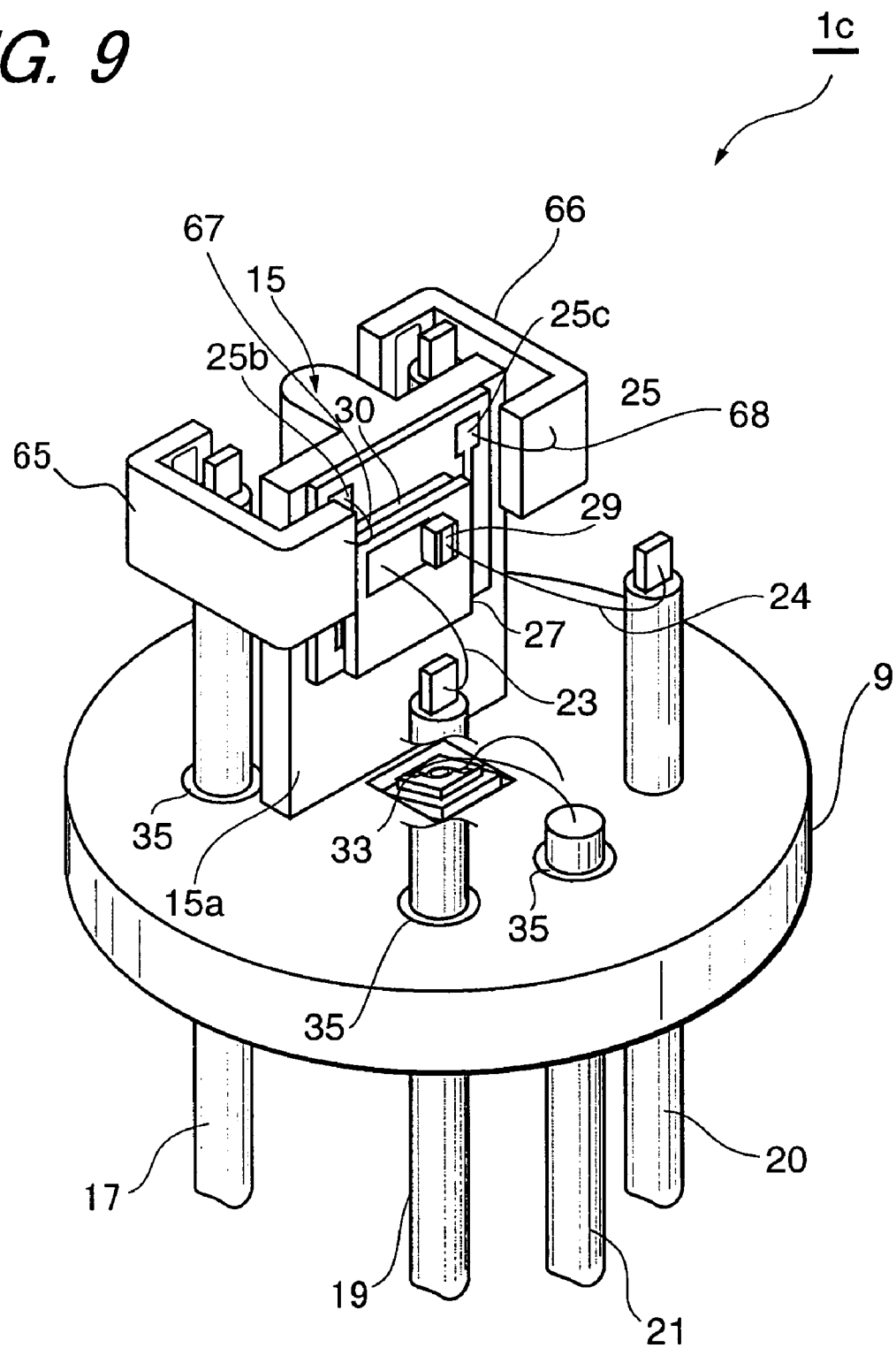
FIG. 9 shows a first modification of the optical module according to the third embodiment.

As shown in FIG. 9, the optical module 1*c* has extension members 65 and 66 in stead of extension members 5 and 6 in the first optical module 1*a*. The extension member 65 has a U-shaped metallic component with two outer sides, one inner side and two elbow portions each connecting the outer side and the inner side. This extension member 65 is disposed such that the inner side thereof detours around the side surface of the sub-mount 15 by some gap. One of outer sides of the extension member 65 provides a surface, to which the wire bonding is carried out, parallel to the mounting surface 15*a*.

The other extension member 66, similarly to the extension member 65, is a U-shaped metallic component, and the thermoelectric device mounted on the mounting surface 15*a* may be wire-bonded to respective outer surfaces of the extension member 65 and 66.

Figure 10:
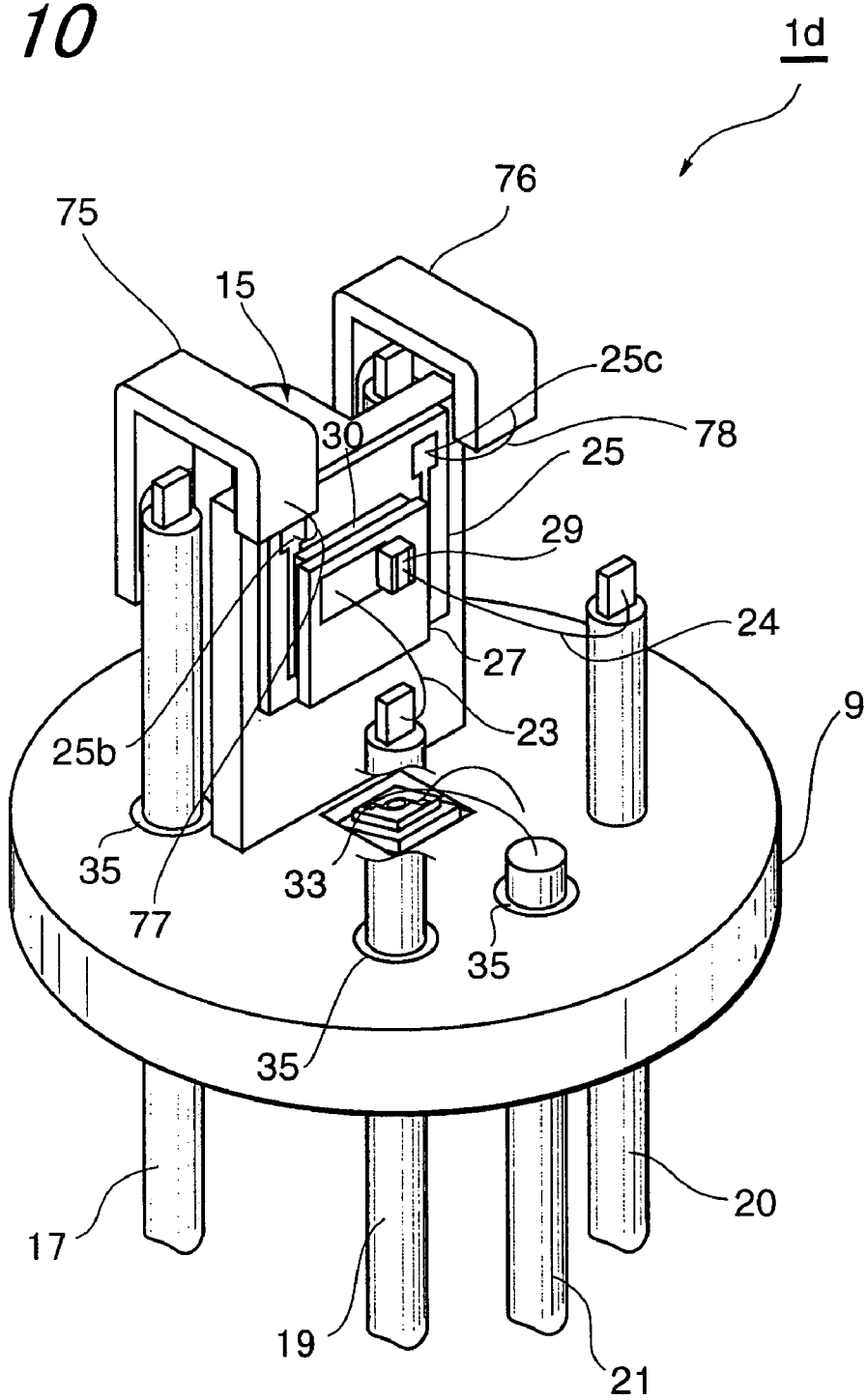
FIG. 10 is a second modification of the optical module according to the third embodiment.

Referring to FIG. 10, an optical module 1*d* has another type of extension members 75 and 76, which are also U-shaped components having two outer sides, one inner side and two elbow portions each connecting the outer side to the inner side. One of outer sides of the extension member 75 is fixed to the lead terminal 17. The thermoelectric device 7 mounted on the mounting surface 15*a* of the sub-mount 15 may be wire-bonded to the other of outer sides of the U-shaped extension member 75. The inner side of the extension member detours around the upper surface of the sub-mount 15 by some gap.

The other extension member 76, similar to the extension member 75, is a U-shaped component fixed to the lead terminal 18. The thermoelectric device 7 mounted on the mounting surface 15*a* may be wire-bonded to the extension members 75 and 76 with bonding wires, thus the thermoelectric device 7 can be electrically connected to the lead terminals 17 and 18 disposed behind the sub-mount 15.

Figure 11:
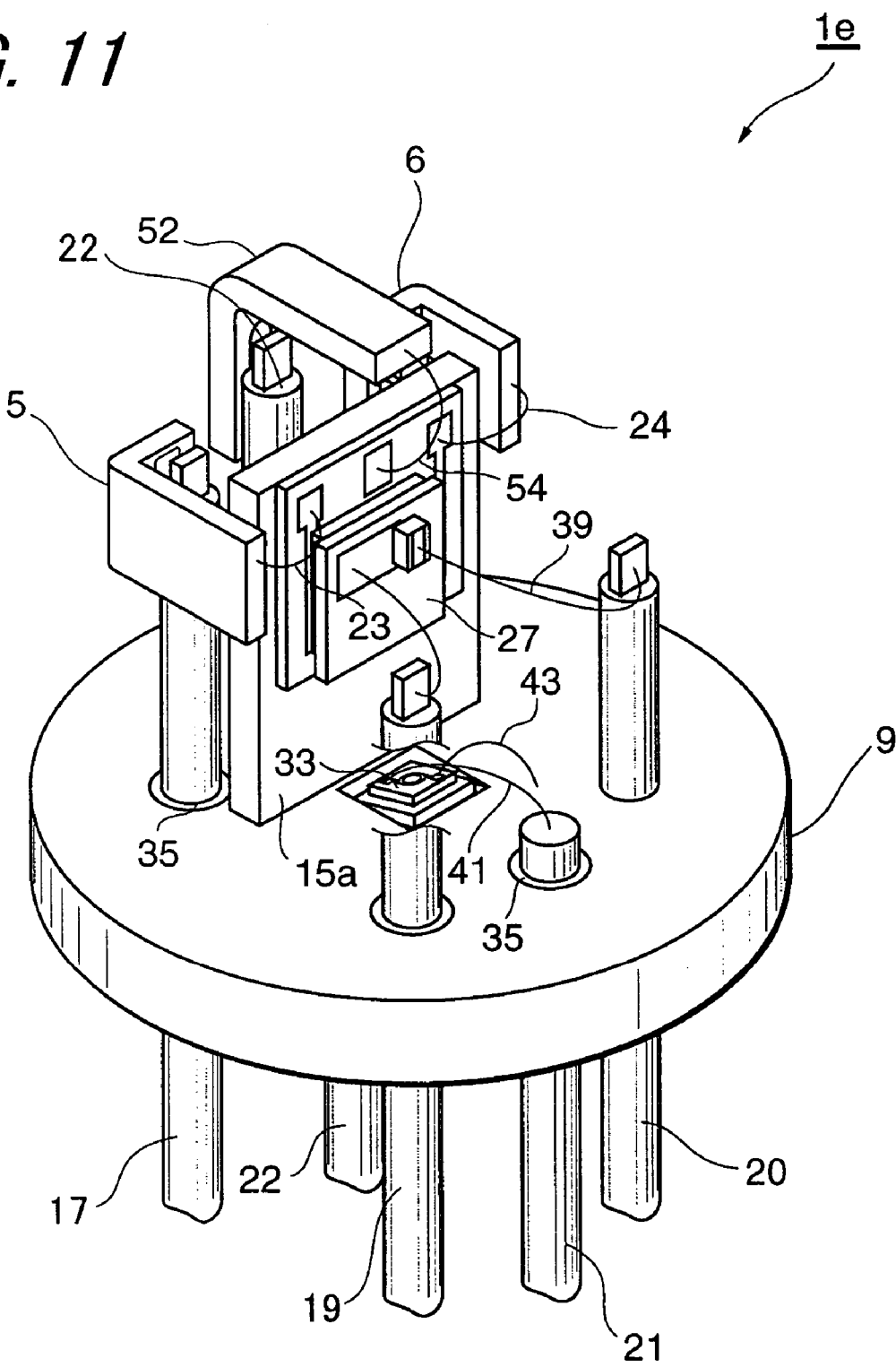
FIG. 11 is a third modification of the optical module according to the third embodiment.

Referring to FIG. 11, an optical module 1*e* has additional lead terminal 22 behind the sub-mount 15. The lead terminal 22 fixes another extension member 52 thereto. The extension member 52 has a structure similar to the structure of the extension member 55 or 56 shown in FIG. 9. The thermoelectric device 7 may be electrically connected to the extension members 52, 55 and 56 with bonding wires 23, 24 and 54, respectively.

The extension members 55, 56 and 52 detour around the sub-mount 15, and are fixed to respective lead terminals 17, 18 and 22 behind the sub-mount 15. Thus the thermoelectric device mounted on the mounting-surface 15*a* of the sub-mount 15 can be connected to the lead terminals disposed behind the sub-mount 15.

Figure 12:
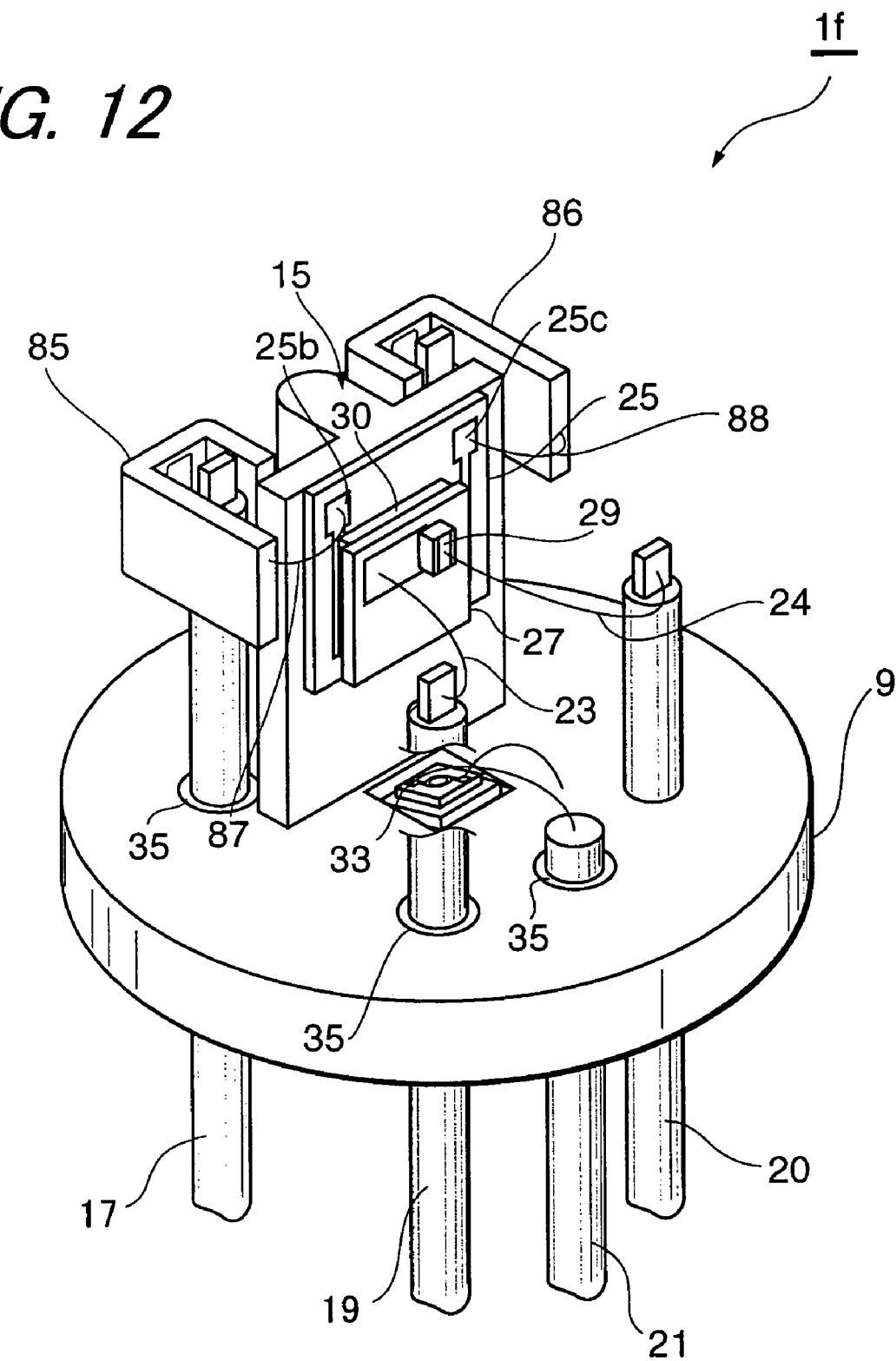
FIG. 12 is a fourth modification of the optical module according to the third embodiment.

Referring to FIG. 12, an optical module 1*f* has another type of extension members 85 and 86 instead of the extension member 5 or 6 in the optical module 1*a*. The extension member 85 is a U-shaped metallic component having two outer sides, one inner side and two elbow portions. The inner side of the extension member 85 is fixed to the lead terminal 17 and two outer sides sandwich the lead terminal 17 therebetween. These configurations of the extension member 85 enable to fix the lead terminal 17 thereto with solder after fitting to each other.

The extension member 86 is, similar to the extension member 85, fixed to the lead terminal 18 by fitting and soldering. The thermoelectric device 7 mounted on the mounting surface 15*a* is electrically connected to the end surfaces of the extension members 86 and 87 with bonding wires 87 and 88.

Optical modules thus describing with accompanying drawings, the restriction regarding to the arrangement of the lead terminal may be removed. The thermoelectric device or the electric device mounted on the mounting surface of the sub-mount may be electrically connected to the lead terminal disposed behind the sub-mount without bending the lead terminal, whereby the thermoelectric device can be included in the module having a CAN-type package and the sub-mount in the package.

What is claimed is:

1. An optical module comprising:
    a package having a CAN-type shape, said package including a stem, a sub-mount having a mounting surface and a plurality of lead terminals, said sub-mount and said lead terminals being provided in said stem such that said lead terminals co-axially surround said sub-mount to position at least one of the lead terminals behind said sub-mount, said mounting surface being substantially perpendicular to said stem;
    a thermoelectric device disposed on said mounting surface of said sub-mount and in front of said sub-mount;
    a light-emitting device mounted on said thermoelectric device; and
    an extension member fixed to said at least one of the lead terminals and electrically connected to said thermoelectric device.

2. The optical module according to claim 1,
    wherein said extension member has a side fixed to said at least one of the lead terminals disposed behind said sub-mount such that said extension member detours around a side surface of said sub-mount.

3. The optical module according to claim 2,
    wherein said extension member is an L-shaped metallic component having two sides and an elbow portion between said two sides, one side of said two sides is fixed to said at least one of the lead terminals and the other of said two sides is electrically connected to said thermoelectric device with a bonding wire.

4. The optical module according to claim 2,
    wherein said extension member is a U-shaped metallic component having two outer sides, an inner side and two elbow portions between said outer side and said inner side, one of outer sides being fixed to said at least one of the lead terminals and the other of said outer sides being electrically connected to said thermoelectric device with a bonding wire, said inner side detouring around a side surface of said sub-mount.

5. The optical module according to claim 2,
    wherein said extension member is a U-shaped metallic component having two outer sides, an inner side and two elbow portions connecting said outer side and said inner side, said inner side being fixed to said at least one of the lead terminals and said two outer sides sandwiching said lead terminal therebetween, one of said two outer sides detouring around a side surface of said sub-mount and being electrically connected to said thermoelectric device with a bonding wire.

6. The optical module according to claim 1,
    wherein said extension member has a side fixed to said at least one of the lead terminals disposed behind said sub-mount such that said extension member detours around a top surface of said sub-mount.

7. The optical module according to claim 6,
    wherein said extension member is an L-shaped metallic component having two sides and one elbow portion, one of said two sides being fixed to said at least one of the lead terminals, the other of said two sides detouring around said sub-mount and being electrically connected to said thermoelectric device with a bonding wire.

8. The optical module according to claim 1,
    wherein said extension member is a U-shaped metallic component having two outer sides, one inner side and two elbow portions connecting said two outer sides and said inner side to each other, one of said two outer sides being fixed to said at least one of the lead terminals and the other of said two outer sides being electrically connected to said thermoelectric device with a bonding wire, said inner side detouring around said top surface of said sub-mount.

9. The optical module according to claim 1,
    wherein said extension member has a hollow to fix said lead terminal thereto with solder.

10. The optical module according to claim 9, wherein said extension member has a groove for receiving excess solder.

* * * * *